(12) United States Patent
Goulet et al.

(10) Patent No.: US 8,377,722 B2
(45) Date of Patent: Feb. 19, 2013

(54) METHODS OF FORMING STRUCTURES WITH A FOCUSED ION BEAM FOR USE IN ATOMIC FORCE PROBING AND STRUCTURES FOR USE IN ATOMIC FORCE PROBING

(75) Inventors: David Raymond Goulet, Milton, VT (US); Walter Victor Lepuschenko, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 388 days.

(21) Appl. No.: 12/703,211

(22) Filed: Feb. 10, 2010

(65) Prior Publication Data

US 2011/0193085 A1      Aug. 11, 2011

(51) Int. Cl.
*G01R 31/26* (2006.01)
*H01L 21/66* (2006.01)

(52) U.S. Cl. .......... 438/14; 438/629; 438/666; 438/675

(58) Field of Classification Search .......... 438/14, 438/626–629, 666, 675, 676
See application file for complete search history.

(56) References Cited

U.S. PATENT DOCUMENTS

| | | | |
|---|---|---|---|
| 5,083,033 A | 1/1992 | Komano et al. | |
| 5,104,684 A | 4/1992 | Tao et al. | |
| 5,700,526 A | 12/1997 | Ximen et al. | |
| 5,827,786 A | 10/1998 | Puretz | |
| 6,171,944 B1 | 1/2001 | Li et al. | |
| 6,316,359 B1* | 11/2001 | Simpson | 438/678 |
| 6,372,627 B1 | 4/2002 | Ring et al. | |
| 6,458,634 B1 | 10/2002 | Stevens | |
| 6,596,640 B1* | 7/2003 | Fishcer et al. | 438/692 |
| 6,952,053 B2 | 10/2005 | Huang et al. | |
| 2002/0195422 A1* | 12/2002 | Sievers et al. | 216/62 |
| 2005/0127926 A1* | 6/2005 | Lee et al. | 324/719 |
| 2005/0227484 A1* | 10/2005 | Gu et al. | 438/667 |
| 2006/0054812 A1* | 3/2006 | Kundalgurki | 250/307 |
| 2007/0031705 A1* | 2/2007 | Hattori et al. | 428/827 |
| 2008/0073580 A1 | 3/2008 | Phaneuf et al. | |

OTHER PUBLICATIONS

Kane, et al., "Atomic Force Probe Kelvin Measurements of Large MOSFET Devices at Contact Level for Accurate Device Threshold Characteristics", Proceedings of the 32nd International Symposium for Testing and Failure Analysis, Nov. 2006, Austin TX USA, pp. 497-502.

Kane, et al., "Challenges of Atomic Force Probe Characterization of Logic Based Embedded DRAM for On-Processor Applications", Proceedings of the 33rd International Symposium for Testing and Failure Analysis, Nov. 2007, San Jose CA USA, pp. 46-51.

Kane, et al., "Electrical Characterization of sub-30nm Gatelength SOI MOSFETs", Proceedings of the 30th International Symposium for Testing and Failure Analysis, Nov. 2004, Worcester MA USA, pp. 33-37.

* cited by examiner

*Primary Examiner* — H. Jey Tsai
(74) *Attorney, Agent, or Firm* — Wood, Herron & Evans, LLP; Anthony J. Canale (57) ABSTRACT

Methods for forming structures to use in atomic force probing of a conductive feature embedded in a dielectric layer and structures for use in atomic force probing. An insulator layer is formed on the dielectric layer such that the conductive feature is covered. A contact hole penetrates from a top surface of the insulator layer through the insulator layer to the conductive feature. The contact hole is at least partially filled with a conductive stud that is in electrical contact with the conductive feature and exposed at the top surface of the insulator layer so as to define a structure. A probe tip of an atomic force probe tool is landed on a portion of the structure and used to electrically characterize a device structure connected with the conductive feature.

11 Claims, 6 Drawing Sheets

METHODS OF FORMING STRUCTURES WITH A FOCUSED ION BEAM FOR USE IN ATOMIC FORCE PROBING AND STRUCTURES FOR USE IN ATOMIC FORCE PROBING

BACKGROUND

The invention relates generally to semiconductor device fabrication and, in particular, to methods of forming structures for use in atomic force probing, as well as structures for use in atomic force probing.

Atomic force probing is routinely used to locate and electrically characterize features in integrated circuits for performing root cause failure analysis of defective devices. In particular, failure analysis investigations can be conducted for sub-0.1 micron complementary metal-oxide-semiconductor (CMOS) technology to contact defective devices. Atomic force probing at the contact level of such CMOS devices permits accurate determination of basic transistor parameters such as transistor drive current in the saturation region ($I_{dsat}$), threshold voltage in the linear region ($V_{tlin}$), and threshold voltage in the saturation region ($V_{tsat}$).

As the technology node shrinks, the physical defects that cause device failures also diminish in size. Because of their limited spatial resolution, it is difficult, if not impossible, to use other types of conventional probing to perform root cause failure analysis at advanced technology nodes. An atomic force probe tool is ideally suited to probe and electrically characterize transistors made with sub-0.1 micron CMOS technologies at the contact layer.

The atomic force probe tool consists of multiple atomic force heads configured to image in a contact mode using sharp probe tips composed of tungsten. The probe tips are scanned in unison across a small surface area of the integrated circuit, which has been delayered to expose the transistor contacts of interest. A force feedback loop is used to maintain a constant force pressing the probe tips against the surface. A nanometer resolution map of the topography of the surface structure is created from the scan. The transistor contacts of interest are identified in the topographic map and their locations are specified. The same probe tips are then used to probe these contacts and electrically characterize the transistor.

Sample preparation is required for probing an integrated circuit to remove overlying metallization levels of a back-end-of-line (BEOL) wiring structure so that an interlayer dielectric containing the contacts of interest for the defective device under investigation can be accessed. One approach for sample preparation is to partially delayer the BEOL wiring structure down to the interlayer dielectric by mechanical polishing to reveal the contacts of interest. Another sample preparation approach is to use a focused ion beam to drill small, deep contact holes through the various interlevel dielectrics to the lower metallization levels in order to access the transistor contacts.

Probe lifetime and image resolution are both limited by the ability of the force feedback loop to timely respond to interactions between the probe tip and the surface. Conventional sample preparation for atomic force probing provides a relatively rough surface topography that is not optimum for atomic force probing. Because the probing is performed in contact move, the probe tips are dragged along the surface. As a result, collisions with objects on the surface can damage the probe tip, which reduces the probe lifetime and the resolution.

After a sample is prepared for atomic force probing, the exposed metal can readily oxidize when exposed to atmosphere and sometimes in a day or less. The oxidation increases the probing resistance, which in turn increases significantly impacts the measurement results. Copper wires are readily prone to rapid oxidation.

Consequently, methods and structures for atomic force probing are needed that overcome these and other disadvantages of conventional atomic force probing techniques and structures.

BRIEF SUMMARY

In an embodiment of the invention, a method is provided for forming a structure to use when atomic force probing a conductive feature embedded in a dielectric layer. The method includes forming an insulator layer on the dielectric layer such that the conductive feature is covered and forming a contact hole in the insulator layer that penetrates from a top surface of the insulator layer through the insulator layer to the conductive feature. The method further includes at least partially filling the contact hole with a conductive stud that is electrically connected with the conductive feature and exposed at the top surface of the insulator layer so as to define the structure. During a probing session, the probe tip of an atomic force probe can be placed in direct physical contact with a portion of the conductive stud.

In another embodiment of the invention, a structure is provided for use with an atomic force microprobe in probing a conductive feature embedded in a dielectric layer. The structure includes an insulator layer on a top surface of the dielectric layer and a conductive stud penetrating from a top surface of the insulator layer through the insulator layer to contact the conductive feature. The insulator layer is positioned on the top surface of the dielectric layer to overlie the conductive feature. A portion of the conductive stud is exposed at the top surface of the insulator layer for direct physical contact by a probe tip of the atomic force microprobe.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1A:
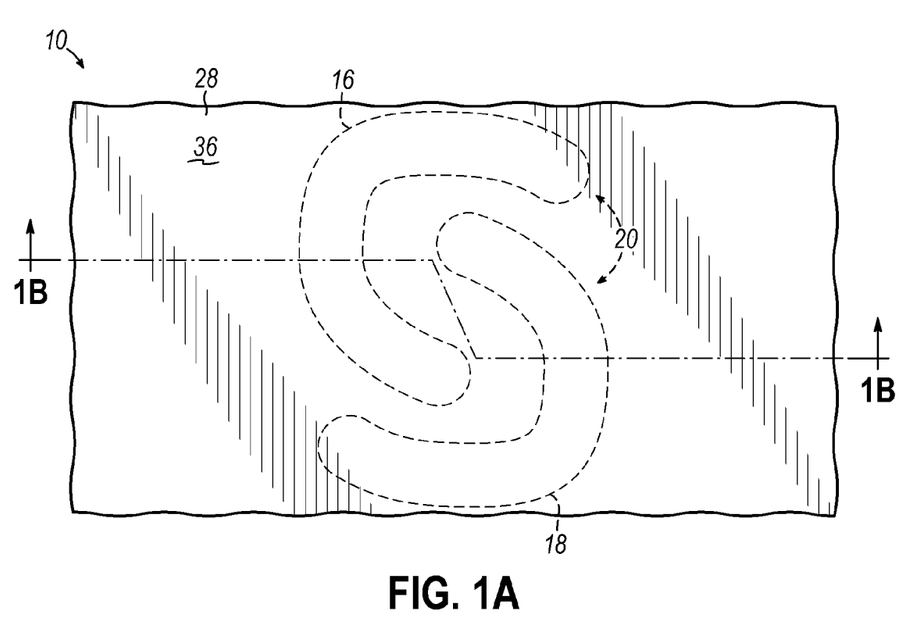
FIG. 1A is a diagrammatic top view of a portion of a substrate and BEOL wiring structure at an initial fabrication stage of a processing method for fabricating a structure for use in an embodiment of the invention.
Figure 1B:
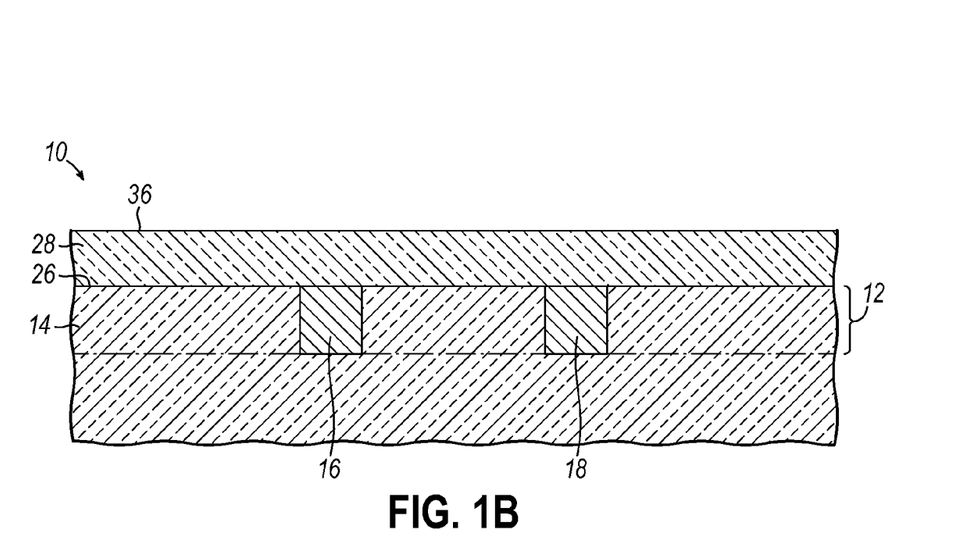
FIG. 1B is a cross-sectional view taken generally along lines 1B-1B of FIG. 1A.

With reference to FIGS. 1A, 1B and in accordance with an embodiment of the invention, a back-end-of-line (BEOL)

wiring structure, generally indicated by reference numeral 10, has been partially delayered by, for example, mechanical polishing to reveal a metallization level 12. Metallization level 12 includes a dielectric layer 14 and conductive features 16, 18 embedded within the dielectric layer 14. The conductive features 16, 18 may be via interconnects or contacts in a local interconnect level that are coupled with an underlying device structure 20, such as a memory cell. The conductive features 16, 18 may have a sub-0.1 micron spacing. The device structure 20 is categorized as defective and is under investigation by atomic force probing for root cause failure analysis. Alternatively, the conductive features 16, 18 may reside in an upper metallization level of the BEOL wiring structure 10. In any event, the partial delayering removes the interlayer dielectric of metallization levels of the BEOL wiring structure 10 above metallization level 12, including the dielectric material and wiring (not shown) immediately overlying dielectric layer 14, so that the conductive features 16, 18 are exposed.

Dielectric layer 14 may comprise any organic or inorganic dielectric material recognized by a person having ordinary skill in the art, which may be deposited by any number of well-known conventional techniques such as sputtering, spin-on application, chemical vapor deposition (CVD) process or a plasma enhanced CVD (PECVD) process. Candidate inorganic dielectric materials for dielectric layer 14 may include, but are not limited to, silicon dioxide ($SiO_2$), fluorine-doped silicon glass (FSG), and combinations of these dielectric materials. Alternatively, the dielectric material constituting dielectric layer 14 may be characterized by a relative permittivity or dielectric constant smaller than the dielectric constant of silicon dioxide, which is about 3.9. Candidate low-k dielectric materials for dielectric layer 14 include, but are not limited to, porous and nonporous spin-on organic low-k dielectrics, such as spin-on aromatic thermoset polymer resins, porous and nonporous inorganic low-k dielectrics, such as organosilicate glasses, hydrogen-enriched silicon oxycarbide (SiCOH), and carbon-doped oxides, and combinations of organic and inorganic dielectrics.

Candidate conductive materials for the conductive features 16, 18 include, but are not limited to, copper (Cu), aluminum (Al), alloys of these metals, other similar metals like tungsten (W), and metal silicides. These types of metals may be deposited by conventional processes including, but not limited to, CVD processes, electrochemical processes like electroplating or electroless plating, and silicidation processes as each is understood by a person having ordinary skill in the art. A relatively thin conductive liner layer (not shown) may respectively clad the metallization of the conductive features 16, 18 such that the conductor is isolated from the surrounding dielectric material of dielectric layer 14 against unwanted diffusion and such that adhesion is enhanced between the conductor and the dielectric material. Representative thin conductive liner layers include, but are not limited to, a bilayer of titanium (Ti) and titanium nitride (TiN) or a bilayer of tantalum (Ta) and tantalum nitride (TaN) applied to the dielectric material by conventional deposition processes.

An insulator layer 28, which is composed of a dielectric material, is deposited on the top surface 26 of the dielectric layer 14. In one embodiment of the invention, the dielectric material contained in the insulator layer 28 is a blanket layer of tetraethylorthosilicate (TEOS), which is deposited across the entire top surface 26 of the dielectric layer 14 with a CVD process and planarized by, for example, a chemical mechanical planarization (CMP) process. An optional high temperature process step may be used to densify the TEOS contained in insulator layer 28. The insulator layer 28 covers the entire top surface 26 without any spatial discrimination and is in direct contact with the dielectric layer 14.

Figure 1C:
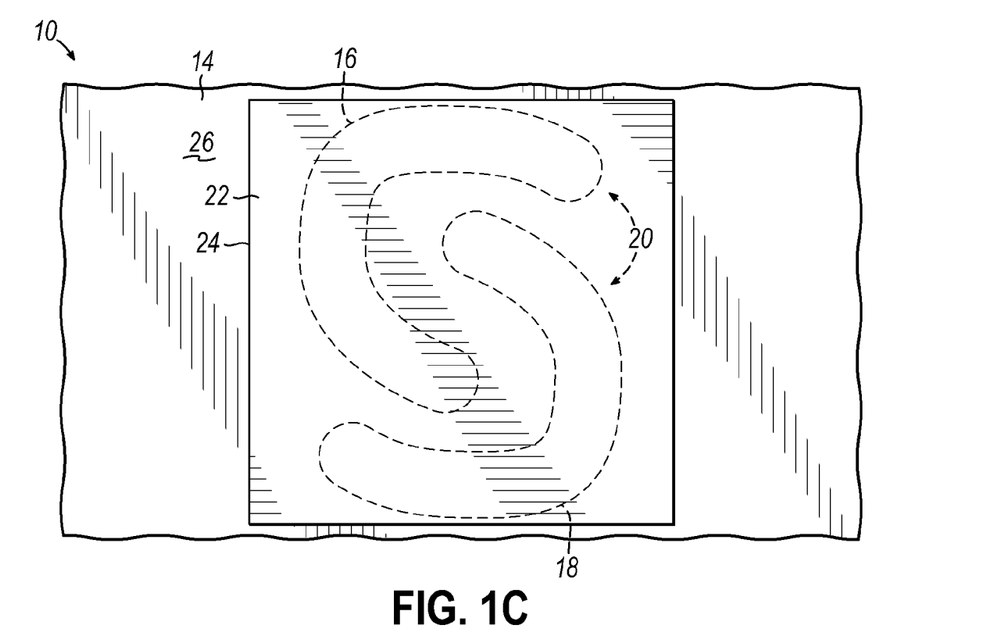
FIG. 1C is a diagrammatic view similar to FIG. 1A in which the insulator layer is only applied to a selected area.

In yet another alternative embodiment and as shown in FIG. 1C, an insulator layer 22, which is similar to insulator layer 28, may be formed with spatial discrimination to protectively cover only the surface area at the site of interest that contains the conductive features 16, 18 for the device structure 20. This localized formation of insulator layer 22 exclusively protects the surface area at the site of interest with a thin film of dielectric material but fails to cover surface areas outside of the site of interest with extraneous dielectric material. As such, the insulator layer 22 is bound within a well-defined outer perimeter 24.

The localized formation of insulator layer 22 relies on a focused ion beam, like focused ion beam 34 (FIG. 2B), to perform an ion beam-induced CVD process. To that end, one or more precursors are delivered proximate to the top surface 26 of the dielectric layer 14 by, for example, gas delivery nozzles and the focused ion beam is scanned across the surface area corresponding to the desired surface area of the insulator layer 22. This permits the definition of a very precise surface area on the top surface 26 of dielectric layer 14 to be coated by the insulator layer 28. For example, the insulator layer 28 may be applied to a surface area on the order of 20 microns by 20 microns in size. Secondary electron emission stimulated by the focused ion beam permits the surface area to be imaged before, while, and after depositing the insulator layer 22.

The one or more precursors used in the ion beam-induced CVD process have a composition appropriate for forming the insulator layer 22. In one embodiment, a suitable precursor may be either TEOS or siloxane, which may be optionally used in conjunction with oxygen as a second precursor. In this instance, the insulator layer 22 formed by a chemical reaction promoted by the interaction of the precursor with the focused ion beam is a $SiO_2$ film. This embodiment permits the entire process forming the contact holes 30, 32 (FIGS. 2A, 2B) and studs 38, 40 (FIGS. 3A, 3B) to be performed in situ within the chamber of an FIB tool, as further explained below.

In another embodiment of the invention, the insulator layer 28 may be an interlayer dielectric of a metallization level overlying metallization level 12. The interlayer dielectric is left intact during the process that partially delayers the BEOL wiring structure 10. In this embodiment, the portion of the insulator layer 28 overlying the conductive features 16, 18 should be free of any other conductive features. This embodiment eliminates the need to deposit a discrete layer of dielectric material to serve as insulator layer 28.

Figure 2A:
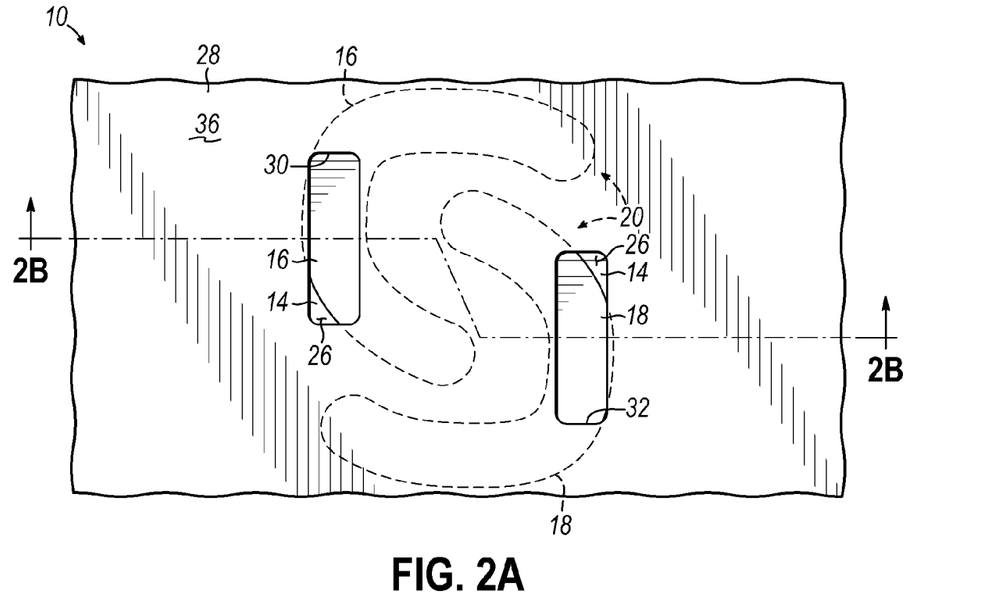
FIGS. 2A and 2B are views similar to FIGS. 1A and 1B, respectively, at a subsequent fabrication stage.
Figure 2B:
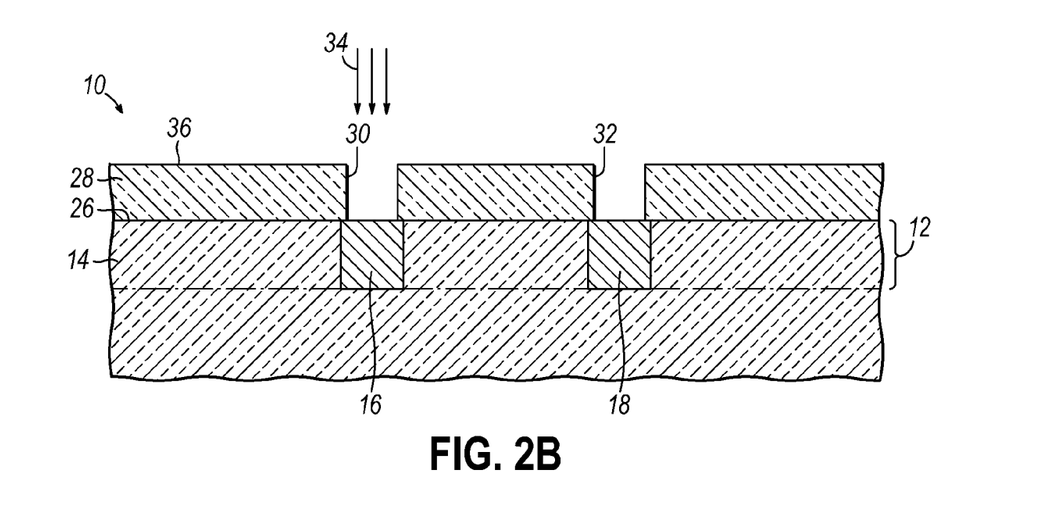

With reference to FIGS. 2A, 2B in which like reference numerals refer to like features in FIGS. 1A, 1B and at a subsequent fabrication stage, contact holes 30, 32 are milled in the insulator layer 28 using a focused ion beam 34 originating from a metal ion source (i.e., gallium or indium). The contact holes 30, 32 are laterally registered in the insulator layer 28 with the locations of the conductive features 16, 18 in the dielectric layer 14. The focused ion beam 34 may be guided to the locations of the device structure 20 associated with the conductive features 16, 18 using CAD navigation based upon layout data stored in a GDSII (GDS2), GL1, OASIS, map files, or any other suitable format. The contact holes 30, 32 penetrate from a top surface 36 of the insulator layer 28 through the insulator layer 28 to the depth of the conductive features 16, 18 and expose the respective top surfaces of the conductive features 16, 18.

Figure 3A:
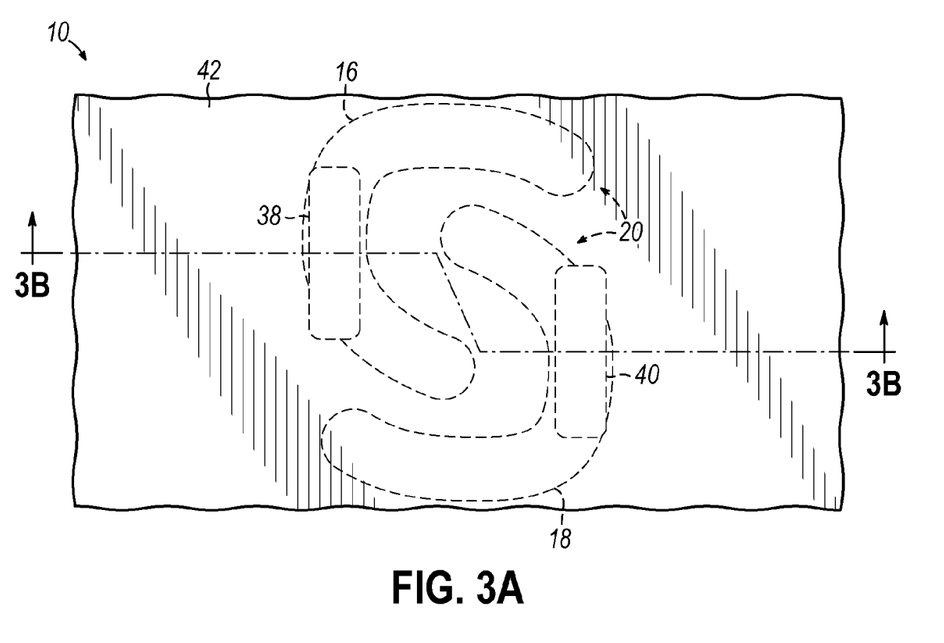
FIGS. 3A and 3B are views similar to FIGS. 2A and 2B, respectively, at a subsequent fabrication stage.
Figure 3B:
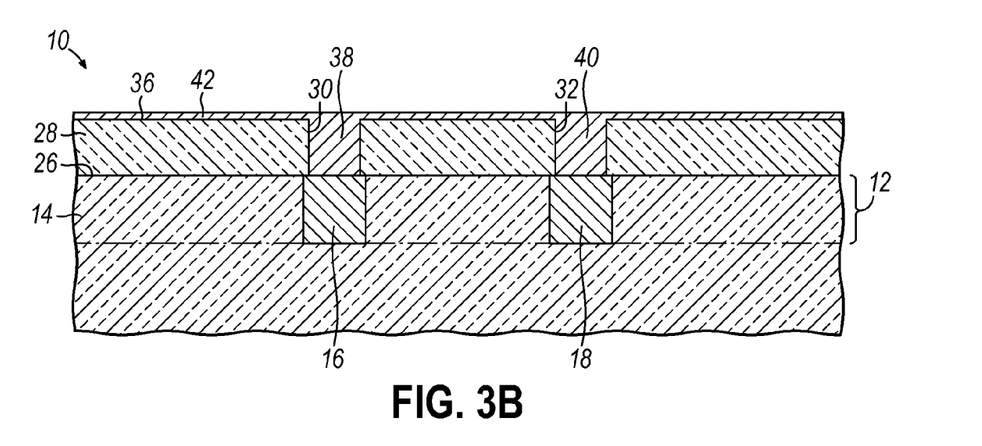

With reference to FIGS. 3A, 3B in which like reference numerals refer to like features in FIGS. 2A, 2B and at a subsequent fabrication stage, the focused ion beam 34 is used to deposit probe pads having the form of studs 38, 40 by an ion-beam induced CVD process within the contact holes 30, 32. The top surface 36 of insulator layer 28 about the contact holes 30, 32 is also coated with a thin layer 42 of the conductor. The studs 38, 40 are formed from a conductor, such as cobalt (Co), molybdenum (Mo), platinum (Pt), tungsten (W), binary or ternary alloys of these metals, or layered combinations of these metals. To deposit the conductor material contained in the studs 38, 40, a metal precursor compound is introduced proximate to the top surface 36 of insulator layer 28 by, for example, gas delivery nozzles. Suitable metal precursor compounds include but are not limited to metal carbonyls, where the metal may be Co, Mo, Pt, W, or a mixture of two or more of these metal carbonyls.

To form the studs 38, 40, a chemical reaction or decomposition process involving the metal precursor compound is induced within the contact holes 30, 32 by precision rastering the focused ion beam 34 across the cross-sectional area of the contact holes 30, 32. The conductor is deposited only in the areas impacted by the focused ion beam 34 and coated by an adsorbed layer of the metal precursor. The studs 38, 40 are built as a lamina stack as successive adsorbed layers of the metal precursor are chemically reacted or decomposed as the focused ion beam 34 is repeatedly scanned in a raster pattern across the cross-sectional area of the contact holes 30, 32. The initial laminas in the lamina stack are electrically connected with the conductive features 16, 18. The studs 38, 40 provide electrical contacts with the conductive features 16, 18 that are accessible from the top surface 36 of the insulator layer 28, which protects the top surface 26 of the dielectric layer 14.

Secondary electron emission induced by the ion bombardment permits the surface area to be imaged before, while, and after depositing the studs 38, 40. The deposited conductor material forming the studs 38, 40 may contain a substantial quantity of impurities that may include the ion beam species of the metal ion source used to form the focused ion beam 34 and decomposition products from the metal precursor compound. However, the ion species of the focused ion beam 34 is also conductive, which limits any degradation of the electrical conductivity of the studs 38, 40 from the presence of the ion species in the deposited conductor. The kinetic energy of the focused ion beam 34, as well as other process conditions, is selected so that the deposition process dominates over sputter-erosion of the conductor material deposited as the studs 38, 40 by the action of the focused ion beam 34.

Copper is avoided as a material for studs 38, 40 because copper readily oxidizes in an oxidizing environment. In contrast, materials such as Co, Mo, Pt and W are relatively resistant to oxidation and, thus, may be readily exposed to atmosphere for lengthier periods, such as over a 24-hour period. By reducing the tendency for the studs 38, 40 to oxidize, time delays with atmospheric exposure between forming the studs 38, 40 and characterizing the device structure 20 connected by the conductive features 16, 18 with the studs 38, 40 are less detrimental to electrical characterization during the probing session.

Figure 4A:
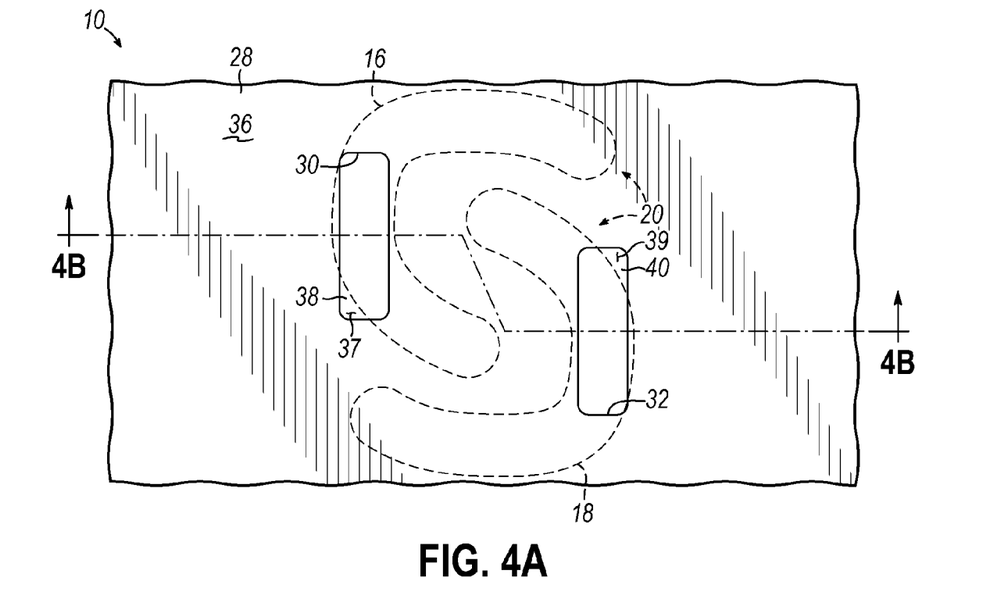
FIGS. 4A and 4B are views similar to FIGS. 3A and 3B, respectively, at a subsequent fabrication stage.
Figure 4B:
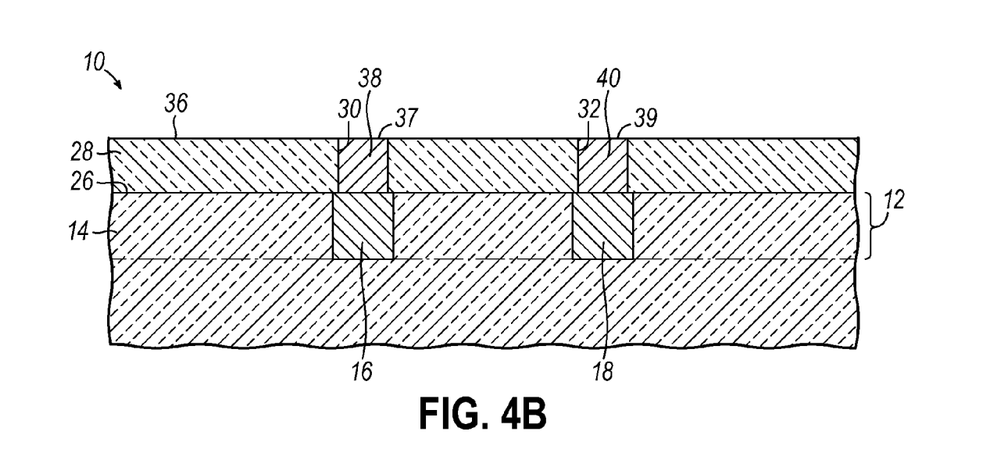

With reference to FIGS. 4A, 4B in which like reference numerals refer to like features in FIGS. 3A, 3B and at a subsequent fabrication stage, the conductor layer 42 is removed from the top surface 36 of insulator layer 28 by one of various approaches. Removal of the conductor layer 42 leaves the studs 38, 40 in an electrically isolated condition separated by an intervening portion of the insulator layer 28.

One approach is to mill the conductor layer 42 from the top surface 36 by sputtering using the focused ion beam 34. The focused ion beam 34 is scanned across regions of the top surface 36 coated by the conductor layer 42. The milling process is halted when the conductor layer 42 is removed and the top surface 36 of insulator layer 28 is exposed.

Another approach is to etch the conductor layer 42 using the focused ion beam 34 in a gas-assisted etching process. A reactive gas is introduced to the top surface 36 and the focused ion beam 34 is scanned across regions of the top surface 36 from which conductor layer 42 is to be etched. The focused ion beam 34, in the presence of the reactive gas, promotes chemical reactions between the reactive gas and the material constituting the conductive layer. The chemical reactions, in conjunction with physical sputtering, cause the removal of the conductor layer 42. The specific type of reactive gas used in conjunction with the focused ion beam 34 depends on the composition of the conductor in the conductor layer 42. For example, the reactive gas may be a halide gas, such as chlorine, bromine, or iodine. The gas-assisted etching process is halted when the top surface 36 of insulator layer 28 is exposed.

The conductor layer 42 may also be removed from the top surface 36 of insulator layer 28 by mechanical action. One approach is to mechanically polish using an abrasive slurry composed of abrasive particles of, for example, alumina or diamond suspended in a liquid carrier. Another approach is to use a slurry in a CMP process that combines abrasive particles with a chemical that corrodes the material of the conductor layer 42. The corrosive chemical present in the slurry reacts with and/or weakens the constituent material of the conductor layer 42 to promote material removal by the abrasive particles in the slurry. The polishing process or CMP process is halted when the conductor layer 42 is removed and the top surface 36 of insulator layer 28 is exposed.

Figure 5A:
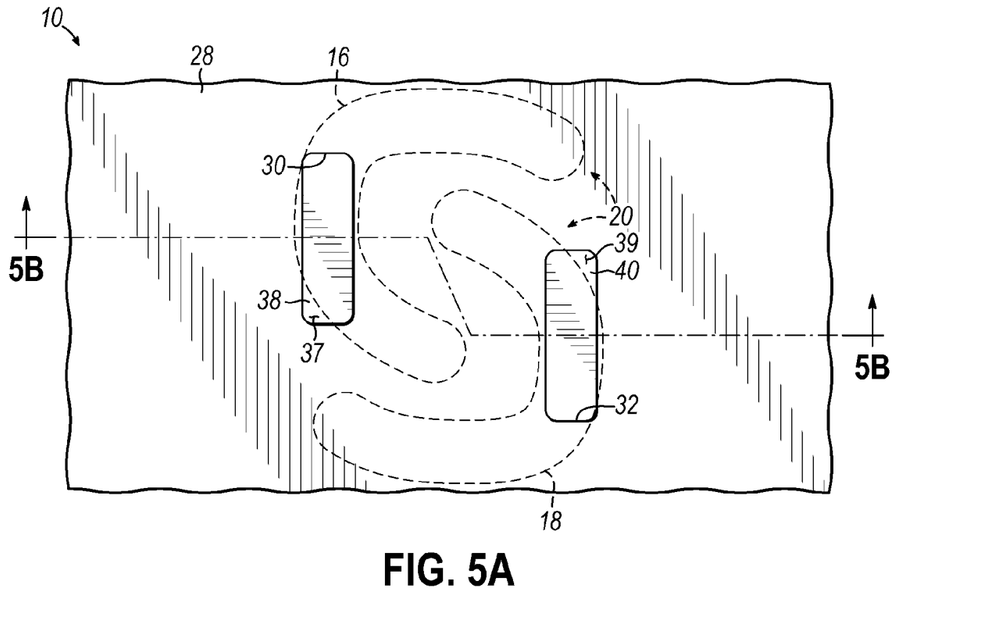
FIGS. 5A and 5B are views similar to FIGS. 4A and 4B, respectively, at a subsequent fabrication stage.
Figure 5B:
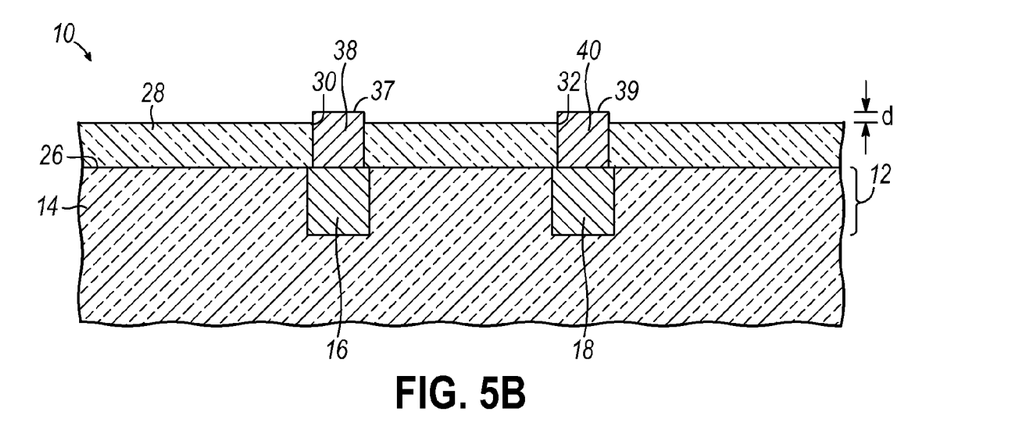

With reference to FIGS. 5A, 5B in which like reference numerals refer to like features in FIGS. 4A, 4B and at a subsequent fabrication stage, the top surface 36 of insulator layer 28 is recessed vertically by a distance, d, relative to top surfaces 37, 39 of the studs 38, 40 using an etching process. The conditions for the etching process are selected to remove the constituent dielectric material of the insulator layer 28 selective (i.e., at a significantly higher etch rate) to the conductor contained in the studs 38, 40. An exemplary etching process, depending upon the composition of the dielectric material and conductor, may be a hydrofluoric acid wet chemical etch. The recess distance, d, may be on the order of about 5 nanometers or less. A solvent rinse may be used to remove residual amounts of the wet chemical etchant. In an alternative embodiment, a reactive ion etching (RIE) process with, for example, a $CF_4$ process gas may be used to recess the insulator layer 28. An exemplary process time for the RIE process is about 15 seconds or so.

Recessing the top surface 36 of insulator layer 28 supplies a slight topography that aids in identification of the device structure 20 of interest when using an atomic force microscope to create a topographic map of the top surface 36 near the studs 38, 40. In particular, the projection of the top surfaces 37, 39 of the studs 38, 39 above the top surface 36 of insulator layer 28 enhances contrast in the topographic map. However, the top surface 36 is relatively smooth in comparison with the conventional approaches used to access the conductive features 16, 18. In comparison with conventional surface preparation, the top surface 36 presents a substantially planar surface near the studs 38, 40, which may operate to extend probe tip life. The presence of the insulator layer 28 offers sample protection during the probing session.

Figure 6:
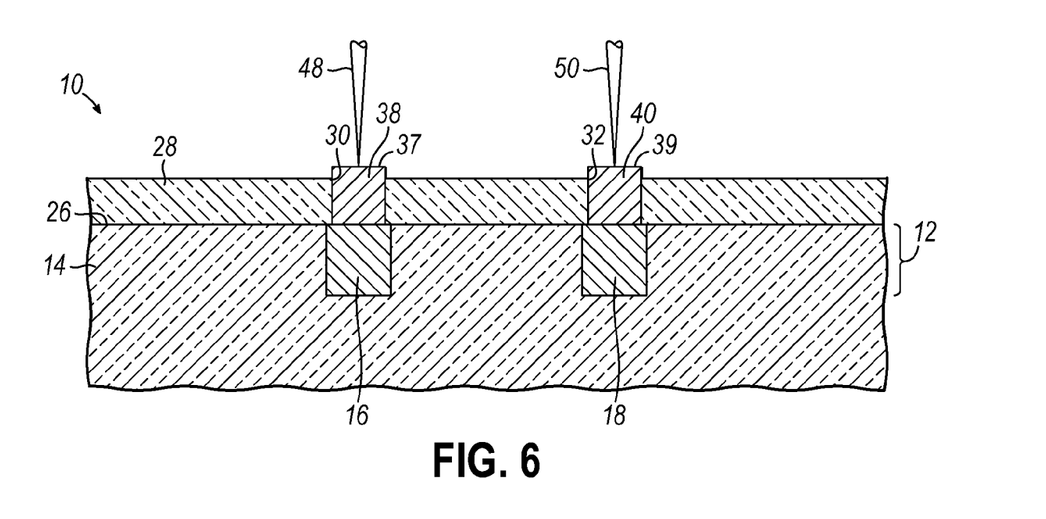
FIG. 6 is a diagrammatic cross-sectional view similar to FIG. 5B that illustrates the use of the structure when using a surface prober to identify contacts for electrical characterization.

With reference to FIG. 6 in which like reference numerals refer to like features in FIG. 5B, the integrated circuit carrying the BEOL wiring structure 10 is placed in an atomic force probing system and investigated during a probing session.

Multiple probe tips, such as the representative probe tips 48, 50, are scanned by the probing system across the top surface 36 of insulator layer 28 and a topographic map of the top surface 36 is generated. The studs 38, 40 represent objects that are imaged in the topographic map. As mentioned above, because of the recessing of the insulator layer 28 that causes a portion of the studs 38, 40 to project above the top surface 36 of the insulator layer 28, the studs 38, 40 are readily located in the topographic map of the top surface 36.

During a subsequent probing session, the topographic map is used as a spatial image to land probe tips 48, 50 of an atomic force probe tool on the top surfaces 37, 39 of the studs 38, 40 and in direct physical contact with the studs 38, 40. The probe tips 48, 50 are then used to determine the electrical characteristics of the device structure 20 connected by the conductive features 16, 18 and studs 38, 40 with the probe tips 48, 50. For example, a parameter analyzer connected to the probe tips 48, 50 may be used to acquire a characteristic UV curve from which threshold voltages and transistor drive currents can be determined. Methods for operating an atomic force probing system to acquire the topographic map, identify the studs 38, 40 and determine their location in the topographic map, and perform electrical measurements are understood by a person having ordinary skill in the art.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "composed of", "includes", "having", "has", "with", or variants thereof are used in either the detailed description or the claims, such terms are intended to be inclusive in a manner similar to the term "comprising."

It will be understood that when an element as a layer, region or substrate is described as being "on" or "over" another element, it can be directly on or over the other element or intervening elements may also be present. In contrast, when an element is described as being "directly on" or "directly over" another element, there are no intervening elements present. It will also be understood that when an element is described as being "attached", "connected", or "coupled" to another element, it can be directly connected or coupled to the other element or intervening elements may be present. In contrast, when an element is described as being "directly attached", "directly connected" or "directly coupled" to another element, there are no intervening elements present.

The fabrication of the structures herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for preparing a structure for atomic force probing of a conductive feature embedded in a dielectric layer, the method comprising:
   removing an interlayer dielectric and wiring of at least one metallization level of a back-end-of-line wiring structure to expose the dielectric layer and the conductive feature;
   after the dielectric layer and the conductive feature are exposed, forming an insulator layer on the dielectric layer so as to cover the conductive feature;
   forming a contact hole in the insulator layer that penetrates from a top surface of the insulator layer through the insulator layer to the conductive feature;
   at least partially filling the contact hole with a conductive stud that is electrically connected with the conductive feature and exposed at the top surface of the insulator layer so as to define a probe pad; and
   recessing the top surface of the insulator layer relative to a top surface of the conductive stud with a wet chemical etch or a reactive ion etching process so that the top surface of the conductive stud projects above the top surface of the insulator layer by 5 nanometers or less.

2. The method of claim 1 wherein forming the insulator layer further comprises:
   reacting one or more precursors with a focused ion beam to form the insulator layer on a scanned portion of the dielectric layer proximate to the conductive feature by an ion-beam assisted chemical vapor deposition process.

3. The method of claim 1 wherein forming the insulator layer further comprises:
   depositing the insulator layer across the top surface of the insulator layer using a chemical vapor deposition process without spatial discrimination.

4. The method of claim 1 wherein forming the contact hole further comprises:
   milling the insulator layer with a focused ion beam to define the contact hole.

5. The method of claim 1 wherein at least partially filling the contact hole with the conductive stud further comprises:
   reacting a metal precursor with a focused ion beam to form the conductive stud in the contact hole in the contact hole by an ion-beam assisted chemical vapor deposition process.

6. The method of claim 1 wherein the conductive stud contains a conductor, and a layer of the conductor is formed on the top surface of the insulator layer, and further comprising:
   milling the layer of the conductor with a focused ion beam to expose the insulator layer about the contact hole and the conductive stud in the contact hole.

7. The method of claim 1 wherein the conductive stud contains a conductor, and a layer of the conductor is formed on the top surface of the insulator layer, and further comprising:
   reacting a reactive gas with a focused ion beam in a gas-assisted etching process to remove the layer of the conductor and expose the insulator layer about the contact hole and the conductive stud in the contact hole.

8. The method of claim 1 wherein the conductive stud contains a conductor, and a layer of the conductor is formed on the top surface of the insulator layer, and further comprising:
   mechanically polishing the layer of the conductor using an abrasive slurry until the layer of the conductor is removed to expose the top surface of the insulator layer near the contact hole and the conductive stud in the contact hole.

9. The method of claim 8 further comprising:
   acquiring a topographic map of the top surface of the insulator layer; and
   identifying the conductive stud in the topographic map relying on surface topology from the protrusion of the top surface of the conductive stud above the top surface of the insulator layer.

10. The method of claim 1 further comprising:
    acquiring a topographic map of the top surface of the insulator layer;
    determining a location of a top surface of the conductive stud in the topographic map;
    landing a probe on the top surface of the conductive stud; and
    executing an electrical measurement of a device structure having a contact that is electrically connected with the conductive stud.

11. The method of claim 1 wherein the conductive stud is comprised of cobalt (Co), molybdenum (Mo), platinum (Pt), or tungsten (W).

* * * * *